United States Patent
Hossain et al.

(10) Patent No.: US 8,203,475 B2
(45) Date of Patent: Jun. 19, 2012

(54) PARALLEL MASH ΔΣ MODULATOR

(75) Inventors: Razak Hossain, San Diego, CA (US);
Andras Pozsgay, Contamine sur Arve (FR)

(73) Assignee: ST-Ericsson SA, Plan-les-Ouates (CH)

( * ) Notice: Subject to any disclaimer, the term of this patent is extended or adjusted under 35 U.S.C. 154(b) by 129 days.

(21) Appl. No.: 12/785,895

(22) Filed: May 24, 2010

(65) Prior Publication Data

US 2011/0285565 A1    Nov. 24, 2011

(51) Int. Cl.
*H03M 3/00* (2006.01)

(52) U.S. Cl. .......................................... 341/143; 341/155

(58) Field of Classification Search ................... 341/143, 341/155
See application file for complete search history.

(56) References Cited

U.S. PATENT DOCUMENTS

| | | | |
|---|---|---|---|
| 5,196,852 A | 3/1993 | Galton | |
| 6,577,259 B1 | 6/2003 | Jelonnek | |
| 7,193,544 B1 | 3/2007 | Fitelson et al. | |
| 7,385,539 B2 | 6/2008 | Vanselow et al. | |
| 7,447,727 B2 * | 11/2008 | Langsdorf | 708/672 |
| 7,548,179 B2 * | 6/2009 | Jalan | 341/143 |
| 2004/0174285 A1 * | 9/2004 | Radja et al. | 341/143 |
| 2005/0225463 A1 * | 10/2005 | Rezeq et al. | 341/143 |
| 2009/0109076 A1 | 4/2009 | Jalan | |

FOREIGN PATENT DOCUMENTS

EP    1491984 A1    12/2004

* cited by examiner

*Primary Examiner* — Brian Young
(74) *Attorney, Agent, or Firm* — Coats & Bennett, P.L.L.C.

(57) ABSTRACT

A parallel, multi-stage noise shaping (MASH) delta-sigma (ΔΣ) modulator reduces the required operating frequency by predicting the inputs to later stages of a serial MASH modulator to be multiples of the MASH input. An Nth order parallel MASH ΔΣ modulator generates N outputs (one from each stage) in a single modulator cycle. Accordingly, the Nth order parallel MASH ΔΣ modulator may be operated at 1/N the frequency of a corresponding prior art Nth order serial MASH ΔΣ modulator.

12 Claims, 2 Drawing Sheets

PARALLEL MASH ΔΣ MODULATOR

FIELD OF THE INVENTION

The present invention relates generally to digital electronics, and in particular to a parallel MASH delta-sigma modulator.

BACKGROUND

Most mobile wireless communication devices comprise a hybrid of digital and analog electronics. For example, baseband signal processing is typically performed in Digital Signal Processors (DSP), with analog front-end receivers (low-noise amplifiers, frequency-selective filters, and the like) and transmitters (modulators, power amplifiers, and the like). Such hybrid designs present challenges in matching fabrication technology (e.g., CMOS digital and bipolar analog transistors), power distribution, noise mitigation, testing, and the like. Additionally, the decreasing supply voltage used to drive low power, high-speed digital baseband circuits imposes limits on analog RF component performance, particularly dynamic range. Accordingly, all-digital implementations for wireless communication circuits are of interest.

One known method of digital signal modulation is a delta-sigma (ΔΣ) modulator. The quantization noise of a ΔΣ modulator may be shifted to (higher) frequencies, and hence easily removed, by noise shaping. A representative first order MultistAge noise SHaping (MASH) ΔΣ modulator is depicted in FIG. 1. An M-bit MASH input signal is captured at a storage function, e.g., a latch or register. The latched input is added to the lower M−1 bits of the output, and the sum is latched. The signal of interest is the most significant bit (MSB), also commonly referred to as a Carry Out bit. The MASH ΔΣ modulator typically oversamples the input, often considerably so.

Better noise shaping may be obtained by serially concatenating a number of first order MASH ΔΣ modulators. FIG. 2 depicts a third order MASH ΔΣ modulator. The Carry Out signals from each modulator stage are combined using simple logic (e.g., buffers, inverters, registers) to generate a MASH output. For example, three Carry Out bits may be decoded to generate a 7-bit value for digital-to-analog conversion. At each successive stage of a MASH ΔΣ modulator, the quantization noise becomes more random, or whiter, and is hence more easily removed. See, e.g., R. Schreier and G. C. Temes, *Understanding Delta-Sigma Data Converters*, IEEE Press, 2005.

Oversampling MASH ΔΣ modulators must run at very high frequencies to implement practical RF transmitters. For example, a third order MASH ΔΣ modulator running at 5.4 GHz was constructed in 65 nm CMOS as part of a fully digital transmitter for a 2.4 to 2.7 GHz WiFi/WiMAX transceiver. See A. Pozsgay, et al., "A Fully Digital 65 nm CMOS Transmitter for the 2.4 to 2.7 GHz WiFi/WiMax Bands Using 5.4 GHz ΔΣ DACs," International Solid State Circuits Conference (ISSCC), 2008, incorporated by reference herein in its entirety. At 5.4 GHz, the cycle time is less than 0.2 nsec. After allowance for clock-to-Q delay, setup time, and margin for clock skew, very little time remains between cycles to perform arithmetic or logical functions. This requires deeper pipelines, since the logic between registers is limited by propagation delay.

SUMMARY

According to one or more embodiments described and claimed herein, a parallel MASH ΔΣ modulator reduces the required operating frequency by predicting the inputs to later stages to be multiples of the MASH input. An Nth order parallel MASH ΔΣ modulator generates N outputs (one from each stage) in a single modulator cycle. Accordingly, the Nth order parallel MASH ΔΣ modulator may be operated at 1/N the frequency of a corresponding prior art Nth order serial MASH ΔΣ modulator.

One embodiment relates to an Nth-order, parallel, MASH ΔΣ modulator, receiving a multi-bit input, and generating a multi-bit output and N carry out bits. The parallel MASH ΔΣ modulator includes N modulator stages, arranged in parallel from a first to an Nth stage, each stage comprising an input storage function; an output storage function; and an adder interposed between the input and output storage functions. The adder is operative to add the output of the input storage function to the [MSB-1:0] bits of the output of the Nth stage output storage function. The MASH input is the input to the first modulator stage, and the parallel MASH ΔΣ modulator includes N−1 adder functions generating the input to the second through Nth modulator stages. Each successive adder function is operative to add another copy of the MASH input, such that the first adder function generates 2× the MASH input to the second modulator stage, and the N−1$^{st}$ adder function generates N× the MASH input to the Nth modulator stage.

One embodiment relates to a method of parallel MASH ΔΣ modulation of an input signal. The outputs of N stages of a serial MASH ΔΣ modulator are predicted by summing multiples of the MASH input and applying the sums to parallel modulator stages, such that each successive parallel modulator stage, other than the first stage, receives an additional multiple of the input. In each parallel modulator stage, the output of the final stage is added to the corresponding multiple of the MASH input. Outputs are conditioned such that the carry out bit of a modulator stage is asserted only if it differs from the MSB output of an adjacent modulator stage.

DETAILED DESCRIPTION

Figure 1:
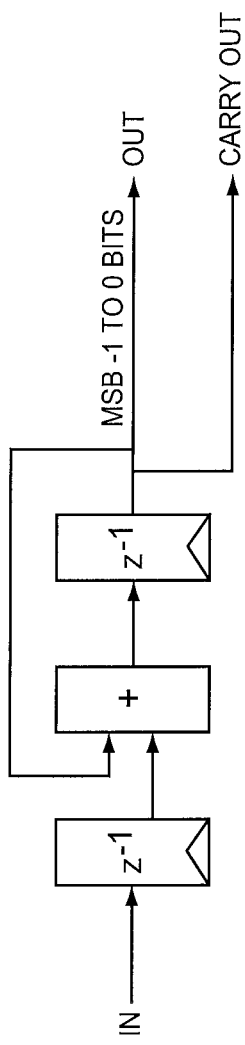
FIG. 1 is a functional block diagram of a prior art first order MASH ΔΣ modulator.

A parallel MASH ΔΣ modulator implementation reduces the speed at which the modulator must run, by predicting the outputs of multiple modulator stages in a single modulator cycle. Referring again to FIG. 1, the output storage function stores and outputs the sum of the modulator input, and the modulator input less the MSB. For an input M, this quantity is approximately M+M=2M. Considering FIG. 2, if the MASH input is M, the output of the first stage—and input to the second stage—is approximately 2M. Similarly, the input to the third stage is approximately 3M, and so on. By predicting these inputs, the serial stages of the MASH ΔΣ modulator of FIG. 3 can be arranged in parallel, and each stage calculate its output at the same time, rather than wait for an input to arrive down the serial chain. Accordingly, the overall operating frequency of an Nth order MASH ΔΣ modulator may be reduced to 1/N, and still generate the same result with the same overall output timing.

Figure 3:
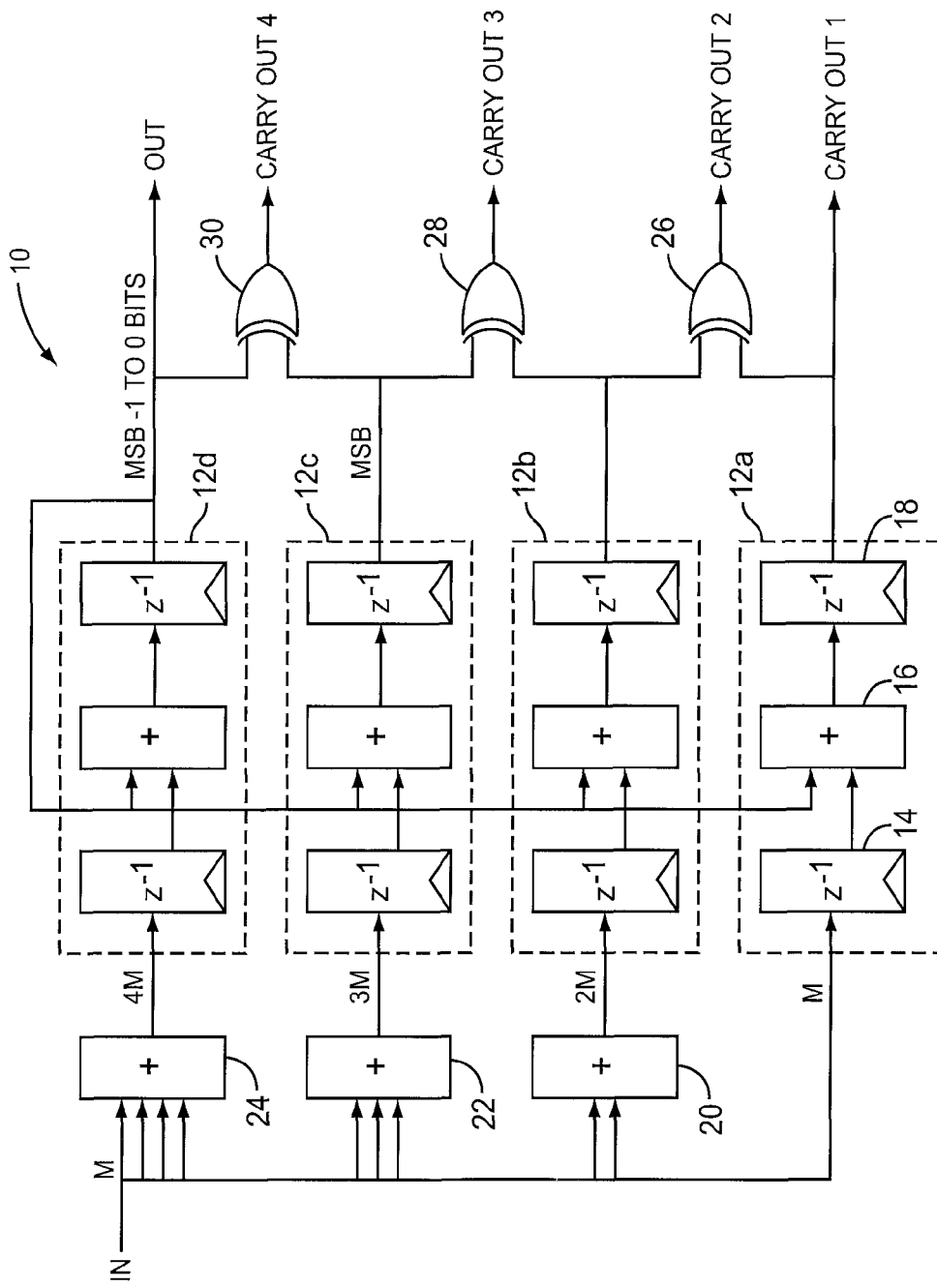
FIG. 3 is a functional block diagram of a parallel, fourth order MASH ΔΣ modulator.

FIG. 3 depicts a representative fourth order, parallel, MASH ΔΣ modulator 10. Of course, those of skill in the art will readily recognize that the design is scalable to an Nth order parallel MASH ΔΣ modulator (N>=2); FIG. 3 depicts an embodiment where N=4. The MASH ΔΣ modulator 10 comprises four stages, 12a-12b, arranged in parallel. Each stage includes an input storage function 14, an adder 16, and an output storage function 18. The storage functions 14, 18 may comprise latches, registers, or other clocked circuits operative to store data values between cycles (as indicated by the notation $Z^{-1}$), as known in the art. The adders 16 each receive the output of the stage's input storage function 14, and add to it the output of the output storage function 18, less the MSB (i.e., output bits MSB−1 to 0). The output of each stage is the MSB of the output storage function 18. Additionally, the fourth (Nth) stage outputs the [MSB−1 to 0] bits of its output storage function 18.

The MASH ΔΣ modulator 10 predicts the inputs at each stage 12a-12d by successively adding copies of the input M to each stage. The input to the first stage 12a is simply the MASH input M. Preceding the input to the second stage 12b is an adder function 20 generating twice the input, or the value 2M. Adder functions 22, 24 generate the values 3M and 4M for input to the third and fourth stages 12c, 12d, respectively. Although depicted in FIG. 3 as adders, those of skill in the art will recognize that the adder functions 20, 24 generating even multiples of the input M may be implemented as shift functions.

Operation of the parallel MASH ΔΣ modulator is best described by considering a "modulator cycle." As used herein, a modulator cycle is the number of clock cycles required for a representative parallel stages to generate an output for a given, stable input M. A modulator cycle generally corresponds to the number of clock cycles required for each separate serial modulator stage to generate an output for the next successive stage in a conventional MASH ΔΣ modulator (e.g., that depicted in FIG. 2). In the embodiment depicted in FIG. 3, for example, a modulator cycle, in pipelined mode, comprises two clock cycles—one required to capture the inputs at the input storage function 14; and one required to capture the sum of input and feedback at the output storage function 18 (at initialization, an additional clock cycle is required to clock the input through to the output storage function 18 so it will be available for feedback). In general, the number of clock cycles per modulator cycle is a parallel MASH ΔΣ modulator design parameter, which will depend primarily on the propagation delay of the logic of adders 16 (or other processing logic) compared to the available cycle time at a given operating frequency.

Whatever the number of clock cycles per modulator cycle for a given embodiment, a parallel MASH ΔΣ modulator generates N outputs per modulator cycle (as opposed to prior art serial MASH ΔΣ modulators, which generate one output per modulator cycle). Stated another way, while a prior art serial MASH ΔΣ modulators generates N outputs over N modulator cycles, the parallel MASH ΔΣ modulator of the present invention generates N outputs in a single modulator cycle, and thus operates at 1/N the frequency of prior art serial MASH ΔΣ modulators. As described above, this is possible by predicting the inputs to the second through Nth modulator stages. In this manner, noise shaping at, e.g., 1 GHz may be obtained by operating a fourth order, parallel MASH ΔΣ modulator at 250 MHz, where a prior art serial MASH ΔΣ modulator must be operated at 1 GHz to achieve the same result.

For proper operation, the MASH modulator input M must be stable over at least one modulator cycle (e.g., two clock cycles in the embodiment depicted in FIG. 3). Since MASH modulators are typically oversampled, this is not usually a significant constraint. Also, since the parallel MASH ΔΣ modulator is operated in a pipeline mode, the outputs the modulator from one modulator cycle are fed back for subsequent calculation in the next modulator cycle.

Figure 2:
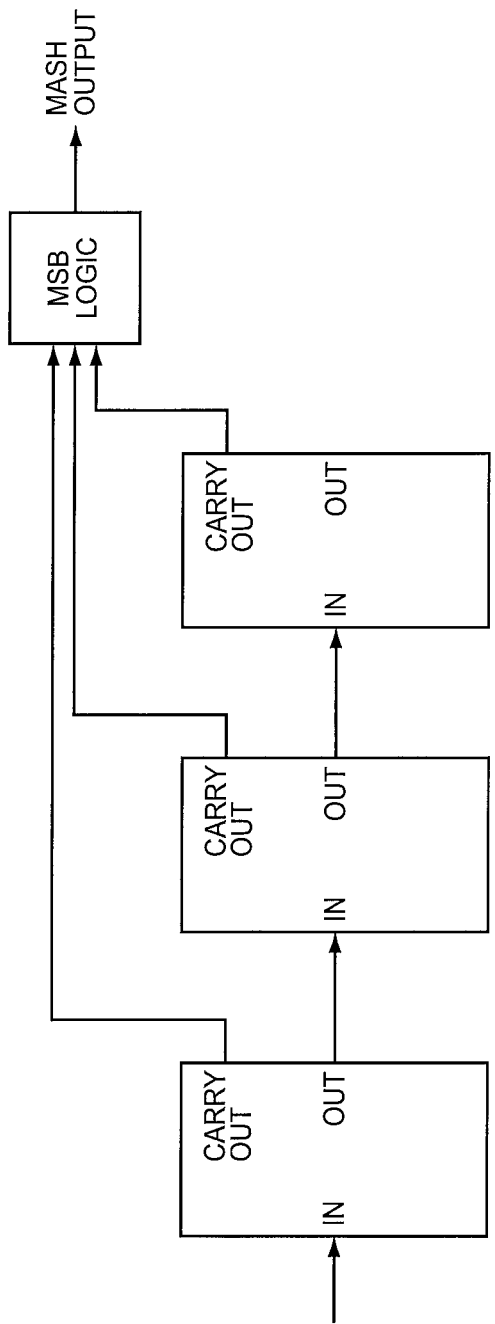
FIG. 2 is a functional block diagram of a prior art third order MASH ΔΣ modulator.

For serial MASH modulators, such as depicted in FIG. 2, the Carry Out bits may be taken as the MSB of each modulator stage. However, in a parallel MASH modulator, such as depicted in FIG. 3, a Carry Out bit should only be asserted for the cycle in which it goes high. For example, if the Carry Out of the $i^{th}$ modulator stage is asserted in one cycle, the Carry Out bit of the $i-1^{st}$ is asserted in the same cycle, but only transitioned to the asserted state in the previous cycle. The XOR gates 26, 28, 30 perform an exclusive-OR function between each MASH modulator stage and the previous stage, to detect changes only in the current cycle.

A fourth order MASH modulator similar to that depicted in FIG. 3 was implemented, achieving 600 psec. operation, using a synthesizable approach with one pipeline stage for every four-bit adder. Such a fourth order MASH modulator corresponds to a serial modulator operating at 6.6 GHz. While the design consumes slightly greater silicon area, it consumes less power, since fewer registers must run at such high frequency. Furthermore, much of the computation can be performed at significantly lower frequency than in the case of a serial modulator, further easing the design effort, consuming less power, and increasing process margin (fast logic is still required for selecting the final output).

The parallel MASH modulator offers the greatest promise for implementing all-digital RF transmitters. However, the invention is not limited to this field of application. In general, the embodiments of a parallel MASH modulator are widely applicable in high-speed digital signal processing, such as in fractional phase locked loop (PLL) circuits, where a MASH modulator is often used to noise shape the spectrum of the PLL.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An Nth-order, parallel, multi-stage noise shaping (MASH) delta-sigma (ΔΣ) modulator, receiving a multi-bit input, and generating a multi-bit output and N carry out bits, comprising:
    N modulator stages, arranged in parallel from a first to an Nth stage, each stage comprising
        an input storage function;
        an output storage function; and
        an adder interposed between the input and output storage functions, the adder operative to add the output of the input storage function to the [MSB−1:0] bits of the output of the Nth stage output storage function;
    whereby the MASH input is the input to the first modulator stage;
    N−1 adder functions generating the input to the second through Nth modulator stages, each successive adder function operative to add another copy of the MASH input, such that the first adder function generates 2× the MASH input to the second modulator stage, and the $N-1^{st}$ adder function generates N× the MASH input to the Nth modulator stage.

2. The parallel MASH ΔΣ modulator of claim 1 wherein each stage is operative to output the most significant bit (MSB) of the output register.

3. The parallel MASH ΔΣ modulator of claim 2 wherein the Nth stage is further operative to output all bits of the output storage function.

4. The parallel MASH ΔΣ modulator of claim 2 wherein the first carry out bit is the MSB of the first modulator stage.

5. The parallel MASH ΔΣ modulator of claim 4 further comprising N−1 XOR gates operative to generate second through Nth carry out bits by XOR-ing each modulator stage MSB output with the output of the prior modulator stage.

6. The parallel MASH ΔΣ modulator of claim 1 wherein the adder functions adding an even number of copies of the MASH input comprise shift registers.

7. The parallel MASH modulator of claim 1 wherein the storage functions comprise latches.

8. The parallel MASH modulator of claim 1 wherein the storage functions comprise registers.

9. The parallel MASH modulator of claim 1 wherein the storage functions are clocked at a frequency at least N times the highest frequency of the MASH input.

10. A method of parallel, multi-stage noise shaping (MASH) modulation of an input signal, comprising:
- summing multiples of a multi-bit MASH input and applying the sums to parallel modulator stages such that each successive parallel modulator stage, other than the first stage, receives an additional multiple of the input;
- in each parallel modulator stage, adding the [MSB−1:0] bits of the output of the Nth stage to the corresponding multiple of the MASH input; and
- conditioning outputs such that the carry out bit of a modulator stage is asserted only if it differs from the MSB output of an adjacent modulator stage.

11. The method of claim 10 further comprising holding the input constant for at least N cycles.

12. The method of claim 10 wherein summing multiples of the MASH input comprises shifting the MASH input for even multiples.

* * * * *